United States Patent
Kim et al.

(10) Patent No.: US 10,644,214 B2
(45) Date of Patent: May 5, 2020

(54) THERMOELECTRIC NANOCOMPOSITE AND PROCESS OF PRODUCING THE SAME

(71) Applicants: Hyundai Motor Company, Seoul (KR); Industry-Academic Cooperation Foundation, Yonsei University, Seoul (KR)

(72) Inventors: Byung Wook Kim, Gyeonggi-do (KR); Kyong Hwa Song, Seoul (KR); Han Saem Lee, Seoul (KR); Jin Woo Kwak, Gyeongsangbuk-do (KR); In Woong Lyo, Gyeonggi (KR); Su Jung Noh, Seoul (KR); Woo Young Lee, Seoul (KR); Gwan Sik Kim, Gyeonggi-do (KR); Sung Mee Cho, Seoul (KR)

(73) Assignees: Hyundai Motor Company, Seoul (KR); Industry-Academic Cooperation Foundation, Yonsei University, Seoul (KR)

(*) Notice: Subject to any disclaimer, the term of this patent is extended or adjusted under 35 U.S.C. 154(b) by 1053 days.

(21) Appl. No.: 15/088,765

(22) Filed: Apr. 1, 2016

(65) Prior Publication Data
US 2017/0110644 A1   Apr. 20, 2017

(30) Foreign Application Priority Data
Oct. 14, 2015 (KR) .................. 10-2015-0143638

(51) Int. Cl.
*H01L 35/18* (2006.01)
*C22C 23/00* (2006.01)
*H01L 35/34* (2006.01)

(52) U.S. Cl.
CPC ............ *H01L 35/18* (2013.01); *C22C 23/00* (2013.01); *H01L 35/34* (2013.01)

(58) Field of Classification Search
CPC .......... H01L 35/18; H01L 35/34; C22C 23/00
See application file for complete search history.

(56) References Cited

U.S. PATENT DOCUMENTS

| 6,225,548 B1 | 5/2001 | Sakakibara et al. |
| 2006/0118158 A1 | 6/2006 | Zhang et al. |

(Continued)

FOREIGN PATENT DOCUMENTS

| CN | 104335327 A | 2/2015 |
| CN | 104349854 A | 2/2015 |

(Continued)

OTHER PUBLICATIONS

S. Fiameni, A. Famengo, F. Agresti, S. Boldrini, S. Battiston, M. Saleemi, et al.Effect of synthesis and sintering conditions on the thermoelectric properties of n-doped Mg2Si. J. Electron. Mater. (2014), pp. 2301-2306.). (Year: 2014).*

(Continued)

*Primary Examiner* — Colleen P Dunn
*Assistant Examiner* — Anthony M Liang
(74) *Attorney, Agent, or Firm* — Mintz Levin Cohn Ferris Glovsky and Popeo, P.C.; Peter F. Corless

(57) ABSTRACT

A thermoelectric nanocomposite is provided. The thermoelectric nanocomposite includes: a matrix having n-type semiconductor characteristics and comprising Mg, Si, Al, and Bi components, and a nanoinclusion comprising Bi and Mg components.

The thermoelectric nanocomposite has significantly increased thermoelectric energy conversion efficiency by simultaneously having an increased Seebeck coefficient and a decreased thermal conductivity, such that the thermoelectric nanocomposite is usefully used to implement a thermoelectric device having high efficiency.

4 Claims, 9 Drawing Sheets

(56) References Cited

U.S. PATENT DOCUMENTS

| | | |
|---|---|---|
| 2008/0176059 A1 | 7/2008 | Benoit et al. |
| 2010/0108115 A1 | 5/2010 | Lee et al. |
| 2013/0269739 A1 | 10/2013 | Hwang et al. |
| 2014/0318593 A1 | 10/2014 | Venkatasubramanian et al. |
| 2015/0139848 A1 | 5/2015 | Soulier et al. |

FOREIGN PATENT DOCUMENTS

| | | |
|---|---|---|
| JP | 2000-164940 A | 6/2000 |
| JP | 2008-523614 A | 7/2008 |
| JP | 2008-305919 A | 12/2008 |
| JP | 2011-134988 A | 7/2011 |
| JP | 2012-253229 A | 12/2012 |
| JP | 5230206 B2 | 7/2013 |
| KR | 2007-0108853 A | 11/2007 |
| KR | 10-2012-0125697 A | 11/2012 |
| KR | 10-2013-0084120 A | 7/2013 |
| KR | 10-1530376 B1 | 6/2015 |

OTHER PUBLICATIONS

Niu, et al., "Thermodynamic assessment of the Bi-Mg binary system", Acta Metallurgica Sinica, vol. 25, No. 1, Feb. 1, 2012, pp. 19-28.

\* cited by examiner ent to the thermoelectric material which is to manufacture a nanocomposite, may be manufacturing a nanograin structure of which a density of a grain boundary is increased by decreasing a grain size to a nano size or manufacturing a nanocomposite in which a phase boundary between a thermoelectric matrix and a secondary phase is formed by introducing the secondary phase having a nano size. In particular, thermal conductivity may be decreased by increasing phonon scattering in the grain boundary and the phase boundary, and the trade-off relationship between the Seebeck coefficient and the electrical conductivity is broken by a carrier filtering effect, thereby making it possible to improve ZT.

THERMOELECTRIC NANOCOMPOSITE AND PROCESS OF PRODUCING THE SAME

CROSS-REFERENCE TO RELATED APPLICATION

This application is based on and claims the benefit of priority to Korean Patent Application No. 10-2015-0143638, filed on Oct. 14, 2015 in the Korean Intellectual Property Office, the disclosure of which is incorporated herein in its entirety by reference.

TECHNICAL FIELD

The present invention relates to a thermoelectric nanocomposite having high thermoelectric conversion efficiency, and more particularly, to a thermoelectric nanocomposite containing a thermoelectric matrix and an inclusion formed in nanometer size.

BACKGROUND

A thermoelectric phenomenon, which is a reversible and direct energy conversion phenomenon between heat and electricity through a solid-state material, is a phenomenon generated by movement of electrons or holes in a thermoelectric material. The thermoelectric phenomenon can be explained with a Peltier effect in which heat is emitted or absorbed when applying current from the outside, a Seebeck effect in which electromotive force is generated from a difference in temperature between both ends of a material, and a Thomson effect in which heat is emitted or absorbed when a current flows in a material having a predetermined temperature gradient.

When using the Peltier effect, a cooling system which does not require a gas compressor and refrigerant gas may be implemented. Further, when using the Seebeck effect, heat generated in a computer, a vehicle engine, or the like, or waste heat generated in various industries may be converted into electric energy.

Recently, as a necessity for a technology of improving energy usage efficiency including vehicle fuel efficiency has increased, an interest in a power generation system using the thermoelectric material has also increased. For example, thermoelectric cooling and thermoelectric power generation efficiency may be directly connected with performance of the thermoelectric material, and to overcome a current limitation of the thermoelectric material restrictively used in a small and special cooling field, development of a high performance material is demanded.

In the related art, thermoelectric energy conversion efficiency indicating performance of the thermoelectric material is presented by dimensionless figure of merit (ZT) represented by the following Equation 1.

$$ZT = \frac{S^2 \sigma T}{\kappa} \quad \text{Equation 1}$$

In Equation 1, S is a Seebeck coefficient, σ is an electrical conductivity, T is an absolute temperature, and κ is a thermal conductivity.

To increase thermoelectric efficiency (i.e. ZT), a thermoelectric material simultaneously having a high Seebeck coefficient, a high electrical conductivity, and a low thermal conductivity may be required. However, since the Seebeck coefficient and the electrical conductivity have a trade-off relationship with a carrier concentration and the electrical conductivity and the thermal conductivity are not independent variables but are affected by each other, it may be complicated to implement a material having high ZT.

One of important strategies for improving performance of the thermoelectric material which is to manufacture a nanocomposite, may be manufacturing a nanograin structure of which a density of a grain boundary is increased by decreasing a grain size to a nano size or manufacturing a nanocomposite in which a phase boundary between a thermoelectric matrix and a secondary phase is formed by introducing the secondary phase having a nano size. In particular, thermal conductivity may be decreased by increasing phonon scattering in the grain boundary and the phase boundary, and the trade-off relationship between the Seebeck coefficient and the electrical conductivity is broken by a carrier filtering effect, thereby making it possible to improve ZT.

A nanostructure may be manufactured in a form of a zero-dimensional quantum dot, a one-dimensional nanowire, a two-dimensional nano plate, and a superlattice thin film, but a nanostructure material providing high ZT in a bulk form is required for actual application.

The above information disclosed in this Background section is merely for enhancement of understanding of the background of the invention and therefore it may contain information that does not form the prior art that is already known in this country to a person of ordinary skill in the art.

SUMMARY

In preferred aspects, the present invention provides a thermoelectric material comprising an Mg—Si component. Accordingly, the thermoelectric material of the invention may provide high applicability as a thermoelectric power generation material at a medium temperature. For instance, the thermoelectric material may be used for a vehicle, due to characteristics such as non-toxicity, a cheap base material, a low density, and the like. In addition, the Mg—Si based thermoelectric material may improve thermoelectric performance by simultaneously implementing a low thermal conductivity and a high power factor, for example, as the thermoelectric performance value may be obtained by multiplying the electrical conductivity and the square of the Seebeck coefficient together.

In one aspect, the present invention provides a thermoelectric nanocomposite that may include a matrix and an inclusion. In particular, the matrix may have n-type semiconductor characteristics and may include Mg, Si, Al, and Bi components and the inclusion may be formed in nanoscale and comprise Bi and Mg components.

The term "n-type semiconductor" or "n-type", as used herein, refers to a material or substance that is created by adding pentavalent impurities or dopants (e.g. phosphorus (P), arsenic (As), and antimony (Sb)), which can donate a free electron A to a semiconductor (substance matrix). As such, n-type semiconductor may include more charge carriers, or electrons available in the material for electric conductivity and thermoelectric effect.

According to an exemplary embodiment of the present invention, a thermoelectric nanocomposite may comprise: a matrix comprising magnesium (Mg), silicon (Si), aluminum (Al), and bismuth (Bi) components; and an inclusion comprising bismuth (Bi) and magnesium (Mg) components. In particular, the matrix may include the components represented by the following Chemical Formula 1 and the inclusion may include the components represented by the following Chemical Formula 2.

$$Mg_{2-x}Al_xSi_{1-y}Bi_y,\quad\text{Chemical Formula 1}$$

where $0\leq x\leq 0.04$, and $0\leq y\leq 0.04$.

$$Bi_2Mg_{3\pm z},\quad\text{Chemical Formula 2}$$

where $0\leq z\leq 0.1$.

The matrix may further include Sn. For instance, the matrix may be represented by the following Chemical Formula 3.

$$Mg_{2-x}Al_xSi_{1-y-w}Bi_ySn_w,\quad\text{Chemical Formula 3}$$

Where $0\leq x\leq 0.04$, $0\leq y\leq 0.04$, and $0\leq w\leq 0.5$.

The inclusion may have an average particle size of about 1 to 500 nm. Unless otherwise indicated, the inclusion in the above range can be referred to as a nanoinclusion. The inclusion or the nanoinclusion may be included at a content of about 0.1 to 4.0 parts by weight based on 100 parts by weight of the matrix.

The term "inclusion" as used herein refers to particles or distinctive substances (e.g. metal particle or metallic compound) formed as being embedded in other materials (e.g. matrix). Preferably, the inclusion may be formed to have distinctive boundaries between the inclusion body and the matrix, to provide additional properties to the matrix. For instance, the components of the thermoelectric nanocomposite as described herein may form inclusions, such as metallic compound of Chemical Formula 2, comprising magnesium (Mg), silicon (Si), aluminum (Al), and bismuth (Bi) components. Accordingly, those inclusions may be formed in distinctive particles having ranges of sizes. In particular, the inclusions may be formed in nanoscale size, which suitably provide physical or chemical properties (e.g. the increased Seebeck coefficient) to the thus formed nanocomposite material.

For example, the matrix may include $Mg_{1.98}Al_{0.02}Si_{0.97}Bi_{0.03}$, and the nanoinclusion may include $Bi_2Mg_3$. A weight ratio of the nanoinclusion to the matrix may be about 2.6%.

Alternatively, the matrix may include $Mg_{1.98}Al_{0.02}Si_{0.97}Bi_{0.04}$, and the nanoinclusion may include $Bi_2Mg_3$. The weight ratio of the nanoinclusion to the matrix may be about 4.0%.

In other example, the matrix may include $Mg_{1.96}Al_{0.04}Si_{0.97}Bi_{0.03}$, and the nanoinclusion may include $Bi_2Mg_3$. The weight ratio of the nanoinclusion to the matrix may be about 1.7%.

In further example, the matrix may include $Mg_{1.96}Al_{0.04}Si_{0.96}Bi_{0.04}$, and the nanoinclusion may include $Bi_2Mg_3$. The weight ratio of the nanoinclusion to the matrix may be about 2.4%.

A density of a phase boundary between the matrix phase and the secondary phase may be about 350 to 4200 $cm^2/cm^3$.

Preferably, the nanoinclusion may have a particle size less than a mean free path of the matrix.

As used herein, the "mean free path" or "carrier mean free path" refers to an average distance traveled by a moving particle (e.g. an atom, a molecule, a photon, or an electron) along its trajectory before impacts (collisions), which modify its direction or energy or other particle properties. For example, the mean free path may be the average distance of particles in the matrix, and particularly, the mean free path may be less than a sized of the inclusion. In another aspect, the present invention provides a process of producing the thermoelectric nanocomposite as described herein. According to an exemplary embodiment of the present invention, a process of producing a thermoelectric nanocomposite may include: (a) preparing a nanocomposite base material powder; and (b) sintering the nanocomposite base material powder obtained in step (a) to obtain a thermoelectric nanocomposite.

The nanocomposite base material powder may be prepared by steps comprising: mixing precursors; and compacting the mixed precursors at a pressure of 10 to 90 MPa at a temperature of about 10 to 30 to form a pellet; and heat treating the pellet under vacuum.

In addition, the heated pellet may be grounded by a ball milling method, an attrition milling method, a high energy milling method, a zet milling method, or a grinding method using a mortar.

The nanocomposite base material powder obtained in step (a) may be sintered by steps comprising: depositing the nanocomposite base material powder obtained in step (a) into a mold having a predetermined shape; and molding the composite base material powder at a temperature of about 500 to 900° C., and a pressure of about 30 to 300 MPa.

Alternatively, the nanocomposite base material powder obtained in step (a) may be sintered by steps comprising: applying a current of about 50 to 500 A at a pressure of about 30 to 300 MPa.

Alternatively, the nanocomposite base material powder obtained in step (a) may be sintered by steps comprising: applying a temperature of about 500 to 900° C. to the nanocomposite base material powder obtained in step (a); and simultaneously sintering and molding the thermoelectric nanocomposite base material powder.

Preferably, an inclusion may be formed or precipitated in the step (b) of sintering.

Further provided in the present invention is a vehicle that may comprise the thermoelectric nanocomposite as described herein.

Other aspect of the invention is disclosed infra.

BRIEF DESCRIPTION OF THE DRAWINGS

The above and other objects, features and advantages of the present invention will be more apparent from the following detailed description taken in conjunction with the accompanying drawings.

DETAILED DESCRIPTION

Figure 1:
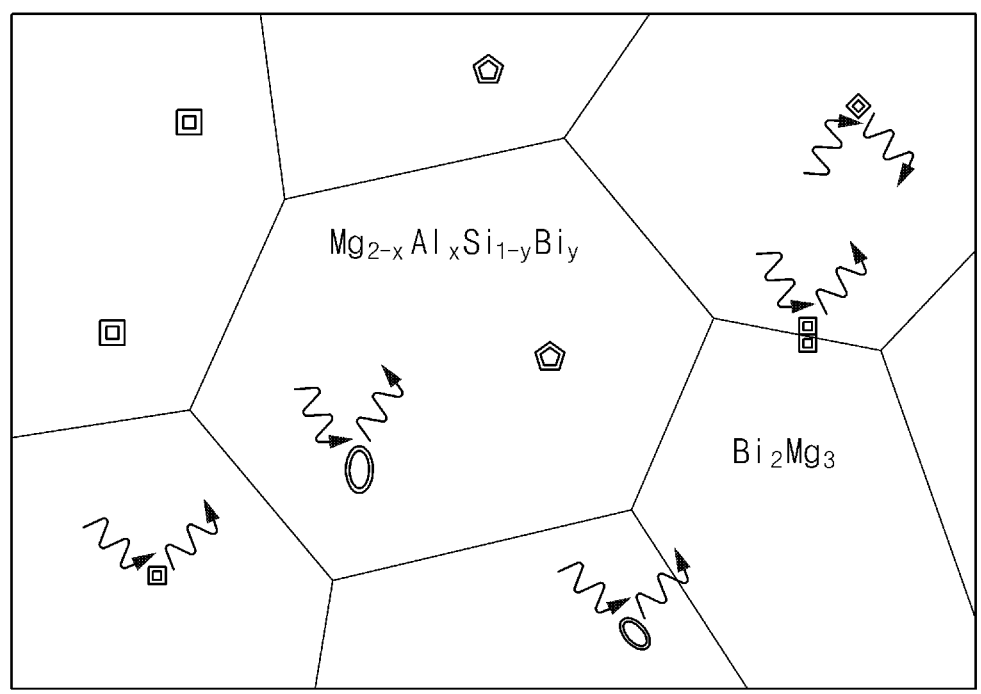
FIG. 1 illustrates exemplary structures of $Mg_{2-x}Al_xSi_{1-y}Bi_y$ as an exemplary matrix phase and an exemplary $Bi_2Mg_3$ nanoinclusion of an exemplary thermoelectric nanocomposite according to an exemplary embodiment of the present invention.

The terminology used herein is for the purpose of describing particular exemplary embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

Unless specifically stated or obvious from context, as used herein, the term "about" is understood as within a range of normal tolerance in the art, for example within 2 standard deviations of the mean. "About" can be understood as within 10%, 9%, 8%, 7%, 6%, 5%, 4%, 3%, 2%, 1%, 0.5%, 0.1%, 0.05%, or 0.01% of the stated value. Unless otherwise clear from the context, all numerical values provided herein are modified by the term "about."

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g. fuels derived from resources other than petroleum). As referred to herein, a hybrid vehicle is a vehicle that has two or more sources of power, for example both gasoline-powered and electric-powered vehicles.

According to an exemplary embodiment of the present invention, a thermoelectric nanocomposite may include: a matrix comprising Mg, Si, Al, and Bi components; and an inclusion (nanoinclusion) comprising Bi and Mg components.

The matrix may be represented by the following Chemical Formula 1:

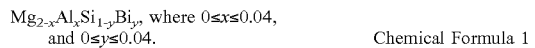

$Mg_{2-x}Al_xSi_{1-y}Bi_y$, where $0 \leq x \leq 0.04$, and $0 \leq y \leq 0.04$.                        Chemical Formula 1

Preferably, the matrix of the above Chemical Formula may have n-type semiconductor characteristics.

The inclusion may be represented by the following Chemical Formula 2:

$Bi_2Mg_{3+z}$, where $0 \leq z \leq 0.1$.                        Chemical Formula 2

In the thermoelectric nanocomposite, the inclusion as a secondary phase may be a nanoinclusion having a size in nanometers, for example, from about 1 nm to about 500 nm. The nanoinclusion may be dispersed in the matrix having n-type semiconductor characteristics to be embedded therein, and thus, a new interface between the matrix and the nanoinclusion may be formed, thereby having an effect of actually introducing a nanostructure. As a consequence, phonon scattering may be increased at the interface, thereby decreasing a lattice thermal conductivity. Further, since compositions of the matrix and the nanoinclusion in the thermoelectric nanocomposite may be different from each other, carriers may be selectively transported by adjusting the compositions of the matrix phase and the secondary phase. In other words, an energy barrier height in the interface between the matrix phase and the secondary phase may be adjusted by adjusting the compositions of the matrix phase and the secondary phase. A carrier filtering effect of selectively transporting only carriers significantly contributing to power factor (e.g. $S^2\sigma$) may be obtained by adjusting the energy barrier height. The Seebeck coefficient (S) may be increased by the carrier filtering effect, and as a result, properties (e.g., thermoelectric energy conversion efficiency, carrier filtering effect and the like) may be improved.

The inclusion or nanoinclusion as the secondary phase may be present in an intragrain region of the matrix in the thermoelectric nanocomposite. Further, the secondary phase may be present in a grain boundary of the matrix. The secondary phase or inclusion may be formed as Mg is volatilized in a process of heat treating base material powder.

Preferably, the secondary phase may include $Bi_2Mg_3$ compound.

The thermoelectric nanocomposite, the inclusion having a nano size refers to a secondary phase having an average particle size less than about 1 μm. For example, an average particle size of the inclusion may be of about 1 to 900 nm, of about 1 to 700 nm, or particularly of about 1 to 500 nm. The size of the inclusion may be less than a carrier mean free path of the matrix.

As used herein, the "mean free path" or "carrier mean free path" refers to an average distance traveled by a moving particle (e.g. an atom, a molecule, a photon, or an electron) along its trajectory before impacts (collisions), which modify its direction or energy or other particle properties. For example, the mean free path may be the average distance of particles in the matrix, and particularly, the mean free path may be less than a sized of the inclusion. When the average particle size of the secondary phase (inclusion) is greater than the carrier mean free path of the matrix phase, the carriers as well as phonons may scatter, and thus, electrical conductivity may be decreased, which may limit a ZT increasing effect.

The nanoinclusion as of the secondary phase may be included in a content range of about 0.1 to 4.0 parts by weight based on 100 parts by weight of the matrix. The thermoelectric energy conversion efficiency (figure of merit, ZT) of the thermoelectric nanocomposite may be further improved in the above-mentioned content range.

The thermoelectric nanocomposite may provide a significantly increased ZT value compared to a conventional thermoelectric material with a structure of the secondary phase or nanoinclusion dispersed in the matrix as described above. Preferably, the thermoelectric nanocomposite may have a figure of merit (ZT) of about 1.0 or greater at a temperature of about 873K.

In the thermoelectric nanocomposite according to the present invention, the secondary phase may be formed as the nanoinclusion in the matrix, thereby forming a high-density phase boundary between the matrix phase and the secondary phase. A density of the phase boundary may be of about 350 to 4200 $cm^2/cm^3$.

The thermoelectric nanocomposite according to the present invention may have a Seebeck coefficient increased due to the carrier filtering effect by band-bending in the phase boundary, and have a lattice thermal conductivity decreased by the phonon scattering in this phase boundary, such that the thermoelectric nanocomposite may have improved ZT characteristics by simultaneously implementing an increase in Seebeck coefficient and a decrease in thermal conductivity.

The thermoelectric nanocomposite may be formed in a bulk phase. Further, the bulk-phase thermoelectric nanocomposite may be manufactured into a pressure-sintered material prepared by compressing and sintering composite base material powder.

Further provided is a process of producing a thermoelectric nanocomposite including: (a) preparing nanocomposite base material powder; and (b) sintering the nanocomposite base material powder obtained in step (a) to obtain a thermoelectric nanocomposite.

Step (a) may include preparing the nanocomposite base material powder for producing the thermoelectric nanocomposite.

For example, precursors (e.g., metal raw materials) of a thermoelectric material may be mixed with each other at a predetermined ratio, and then cold-compacted at a temperature of about 10 to 30 at a pressure of about 10 to 90 MPa, thereby preparing a precursor pellet. Subsequently, the precursor pellet may be heat treated under vacuum for 2 to 10 hours, to prepare the thermoelectric nanocomposite. However, the conditions are not necessarily limited thereto, but may be suitably changed in a range in which the ZT of the thermoelectric material may be improved.

Thereafter, the composite base material may be ground by a ball milling method, an attrition milling method, a high energy milling method, a zet milling method, a grinding method using a mortar, or the like. However, a grinding method is not necessarily limited thereto, but all methods capable of being used in the art as a method of dry-grinding the base material to prepare powder may be used.

Step (b) may include sintering the nanocomposite base material powder obtained in step (a) to prepare the thermoelectric nanocomposite.

The sintering may be performed by a sintering process generally used in the related art, for example, a pressure-sintering process. For example, thermoelectric nanocomposite may be prepared by a hot-press method of putting composite base material powder into a mold having a predetermined shape and molding the composite base material powder at a high temperature, for example, about 500 to 900° C., and a high pressure, for example, about 30 to 300 MPa. In addition, thermoelectric nanocomposite may be prepared using a spark plasma sintering method of sintering raw materials within a short period of time by applying a high-voltage current at a high pressure to the composite base material powder, for example, applying a current of about 50 to 500 A at a pressure of about 30 to 300 MPa. For example, thermoelectric nanocomposite may be prepared by a hot-forging method of applying a high temperature, for example, a temperature of about 500 to 900° C. to extrude and sinter thermoelectric nanocomposite base material powder at the time of pressure-molding.

Further, the sintering may be performed at a temperature of 600 to 800° C. under a pressure of 1 to 100 MPa in vacuum for 1 to 10 minutes using the spark plasma sintering method, or the like. However, the conditions are not necessarily limited thereto, but may be suitably changed in a range in which the figure of merit of the thermoelectric nanocomposite may be improved.

The thermoelectric nanocomposite prepared by the sintering process may have a density corresponding to about 70% to 100% of a theoretical density. The theoretical density is calculated by dividing a molecular weight by an atomic volume and may be evaluated by a lattice constant. For example, the thermoelectric nanocomposite may have a density of about 95 to 100%, and thus, the thermoelectric nanocomposite may have a substantially increased electrical conductivity.

The bulk-phase thermoelectric nanocomposite may be prepared in various forms, and a high-efficiency thermoelectric device having a thin thickness of 1 mm or less may be implemented. Since the thermoelectric nanocomposite may be easily prepared as a bulk phase and provide a high figure of merit even in the bulk phase, the thermoelectric nanocomposite may have high commercial applicability.

The secondary phase may be precipitated in the sintering process, such that the thermoelectric nanocomposite may be formed.

EXAMPLE

Hereinafter, the present disclosure will be described in more detail through the following Examples and Experimental Examples. However, the following Examples and Experimental Examples are only to illustrate the present disclosure, and the scope of the present disclosure is not limited thereto.

Example 1

Preparation of $Mg_{1.98}Al_{0.02}Si_{0.97}Bi_{0.03}$+ $Bi_2Mg_3$ (Weight Ratio of $Bi_2Mg_3$ to $Mg_{1.98}Al_{0.02}Si_{0.97}Bi_{0.03}$: 2.6%)

Precursors (e.g., metal raw materials) of a thermoelectric material were mixed with each other at a predetermined ratio and blended in a mortar for 10 to 30 minutes. The blended base material powder was cold-compacted at a pressure of 10 to 90 MPa, thereby preparing a precursor pellet. Thereafter, the compacted precursor pellet was charged into a boat quartz and heat treated in a circular furnace in vacuum for 4 to 10 hours, thereby preparing Mg—Si based thermoelectric nanocomposite powder.

Thereafter, the composite base material was prepared to powder having a size of 50 μm or less by grinding in the mortar.

Further, the prepared powder was sintered at a temperature of 600 to 800° C. under a pressure of 1 to 100 MPa in vacuum for 1 to 10 minutes using a spark plasma sintering method.

Figure 2:
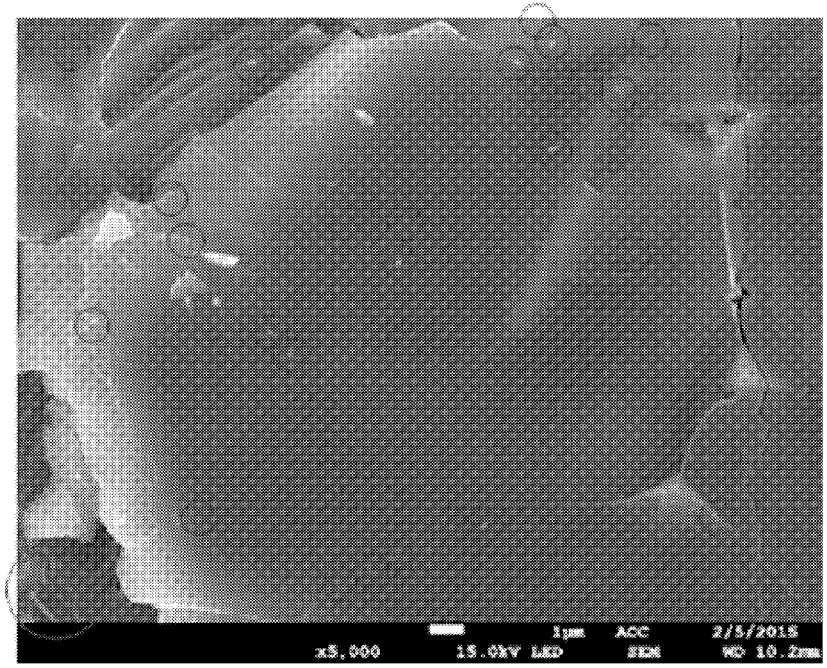
FIG. 2 is an exemplary scanning electron microscope (SEM) image showing a microstructure of an exemplary $Mg_{2-x}Al_xSi_{1-y}Bi_y$ matrix and an exemplary $Bi_2Mg_3$ nanoinclusion of an exemplary thermoelectric material prepared in Example 1 according to an exemplary embodiment of the present invention.

As illustrated in FIG. 2, in the prepared thermoelectric material, structures of a $Mg_{1.98}Al_{0.02}Si_{0.97}Bi_{0.03}$ matrix and a $Bi_2Mg_3$ nanoinclusion present in the matrix may be confirmed. As a result of inductive coupled plasma (ICP) analysis, the entire composition of the prepared thermoelectric material was $Mg_{1.98}Al_{0.02}Si_{0.97}Bi_{0.03}+Bi_2Mg_3$ (weight ratio of $Bi_2Mg_3$ to $Mg_{1.98}Al_{0.02}Si_{0.97}Bi_{0.03}$: 2.6%).

Example 2

Preparation of $Mg_{1.98}Al_{0.02}Si_{0.96}Bi_{0.04}+ Bi_2Mg_3$ (Weight Ratio of $Bi_2Mg_3$ to $Mg_{1.98}Al_{0.02}Si_{0.96}Bi_{0.04}$: 4.0%)

A thermoelectric nanocomposite was prepared by the same method as in Example 1.

Example 3

Preparation of $Mg_{1.96}Al_{0.04}Si_{0.97}Bi_{0.03}+ Bi_2Mg_3$ (Weight Ratio of $Bi_2Mg_3$ to $Mg_{1.96}Al_{0.04}Si_{0.97}Bi_{0.03}$: 1.7%)

A thermoelectric nanocomposite was prepared by the same method as in Example 1.

Example 4

Preparation of $Mg_{1.96}Al_{0.04}Si_{0.96}Bi_{0.04}+Bi_2Mg_3$ (Weight Ratio of $Bi_2Mg_3$ to $Mg_{1.96}Al_{0.04}Si_{0.96}Bi_{0.04}$: 2.4%)

A thermoelectric nanocomposite was prepared by the same method as in Example 1.

Comparative Example 1

Journal of Physics and Chemistry of Solids 75 (2014) 984

Precursors (for example, metal raw materials) of a thermoelectric material were mixed at a predetermined ratio and then ball-milled for 1 hour. Next, a precursor pellet was prepared by cold-compacting the mixture under a pressure of 500 Mpa. The precursor pellet was heat treated in vacuum for 1 hour, thereby preparing Mg—Si based thermoelectric material powder.

Thereafter, the prepared Mg—Si based thermoelectric material powder was sintered at a temperature of 700 to 900° C. under a pressure of 1 to 100 MPa in vacuum for 30 to 100 minutes using a hot press sintering method.

Experimental Example 1

Measurement of Electrical Conductivity, Seebeck Coefficient, and Power Factor

Figure 3:
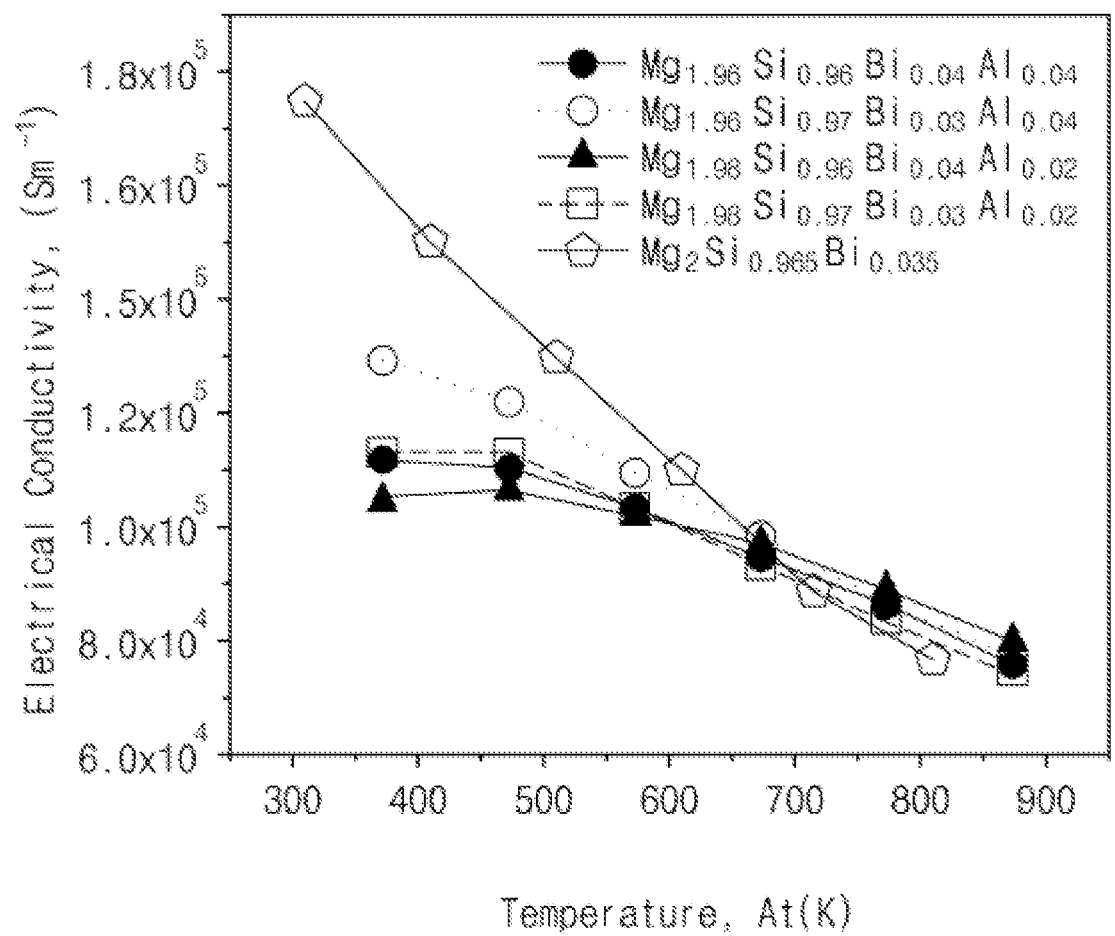
FIG. 3 illustrates results obtained by measuring electrical conductivities of thermoelectric materials prepared in Comparative Example and Examples 1 to 4 according to exemplary embodiments of the present invention.
Figure 4:
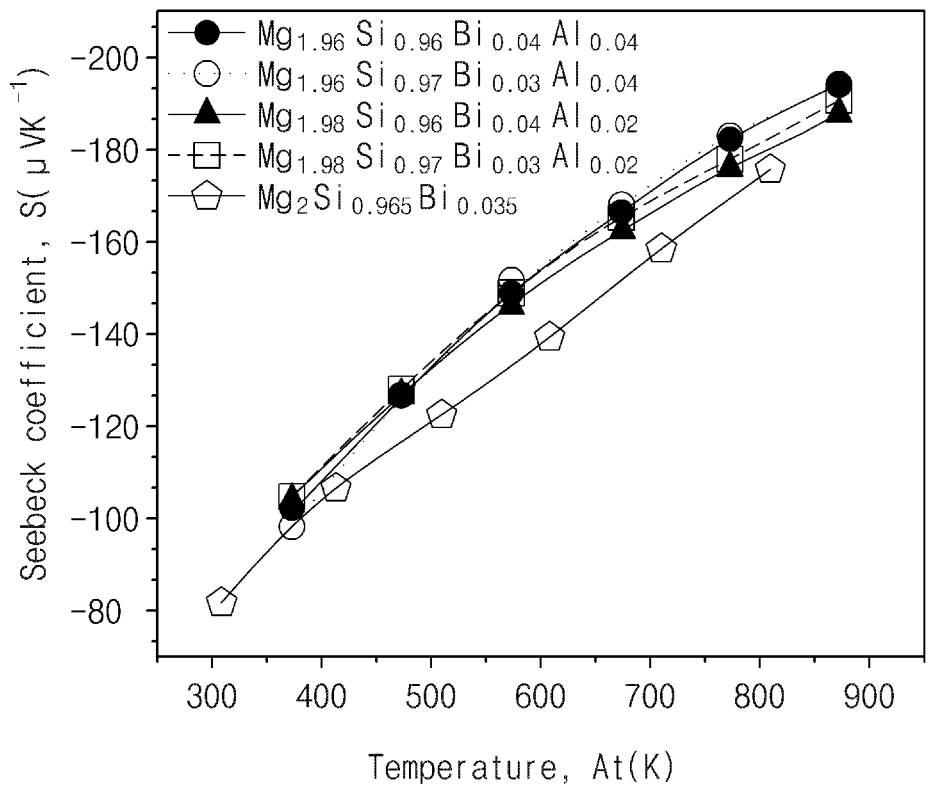
FIG. 4 illustrates results obtained by measuring Seebeck coefficients of the thermoelectric materials prepared in Comparative Example and Examples 1 to 4 according to exemplary embodiments of the present invention.
Figure 5:
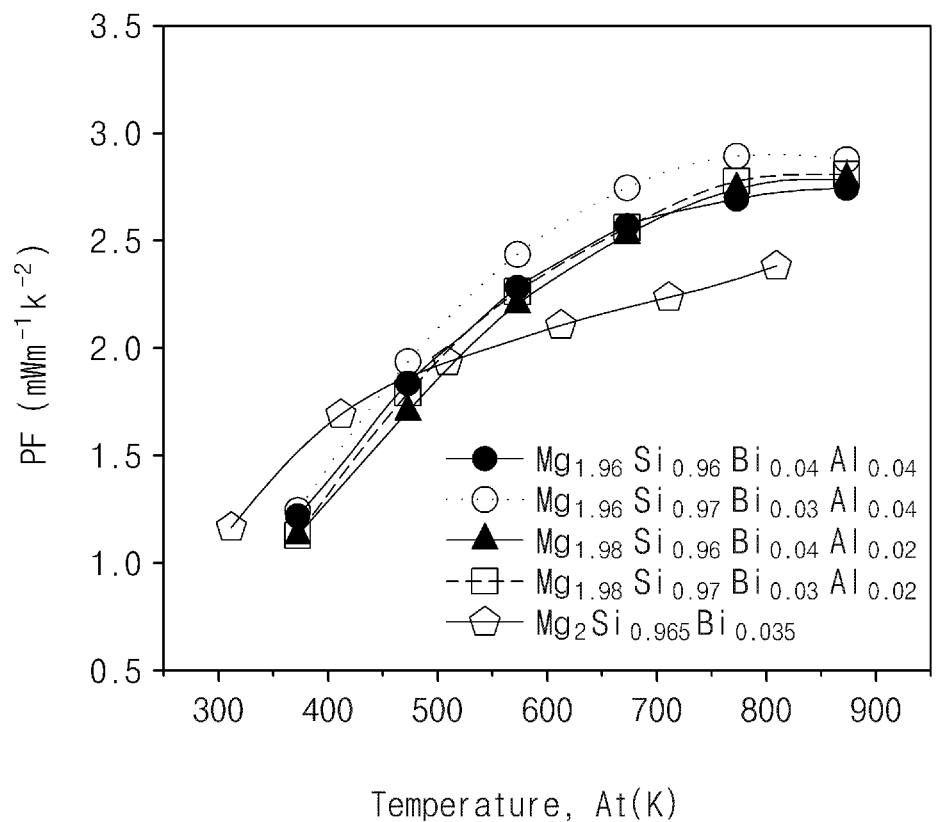
FIG. 5 illustrates results obtained by measuring power factors of the thermoelectric materials prepared in Comparative Example and Examples 1 to 4 according to exemplary embodiments of the present invention.

Electrical conductivities and Seebeck coefficients of the thermoelectric materials prepared in Comparative Example and Examples 1 to 4 were measured using ZEM-3 (ULVAC-RIKO Inc.), and the results are shown in FIGS. 3 and 4, respectively. Power factors were calculated from the measured electrical conductivities and Seebeck coefficients, and the results are illustrated in FIG. 5.

In Examples 1 to 4, the electrical conductivities were low, but the Seebeck coefficients were high as compared to Comparative Example. It may be determined that the results were caused by the carrier filtering effect by band bending. Therefore, as shown in FIG. 5, when the power factors were calculated, the power factors of the thermoelectric materials prepared in Examples 1 to 4 were increased by about 20% as compared to the thermoelectric material prepared in Comparative Example.

Experimental Example 2

Measurement of Thermal Conductivities, Power Factors, and Figure of Merit (ZT)

Figure 7:
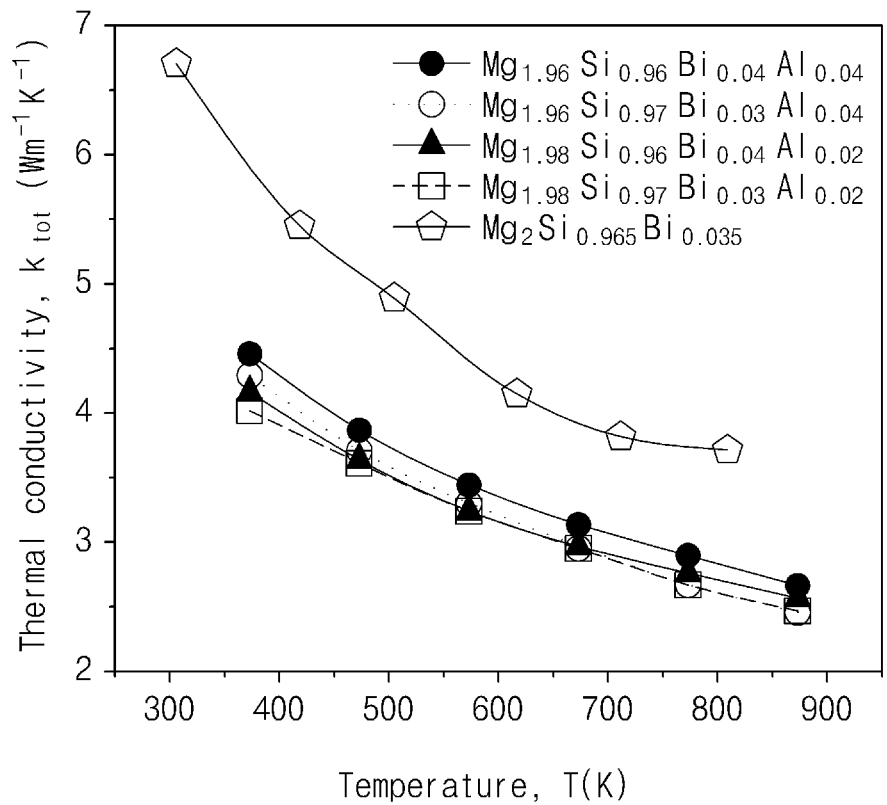
FIG. 7 illustrates results obtained by measuring thermal conductivities of the thermoelectric materials prepared in Comparative Example and Examples 1 to 4 according to exemplary embodiments of the present invention.

Thermal conductivities were calculated from thermal diffusivities measured using Netzsch LFA-457 (Laser Flash method), and the results were illustrated in FIG. 7. Lattice thermal conductivities and thermoelectric figures of merit (ZTs) calculated from the results are shown in FIGS. 8 and 9, respectively.

Figure 8:
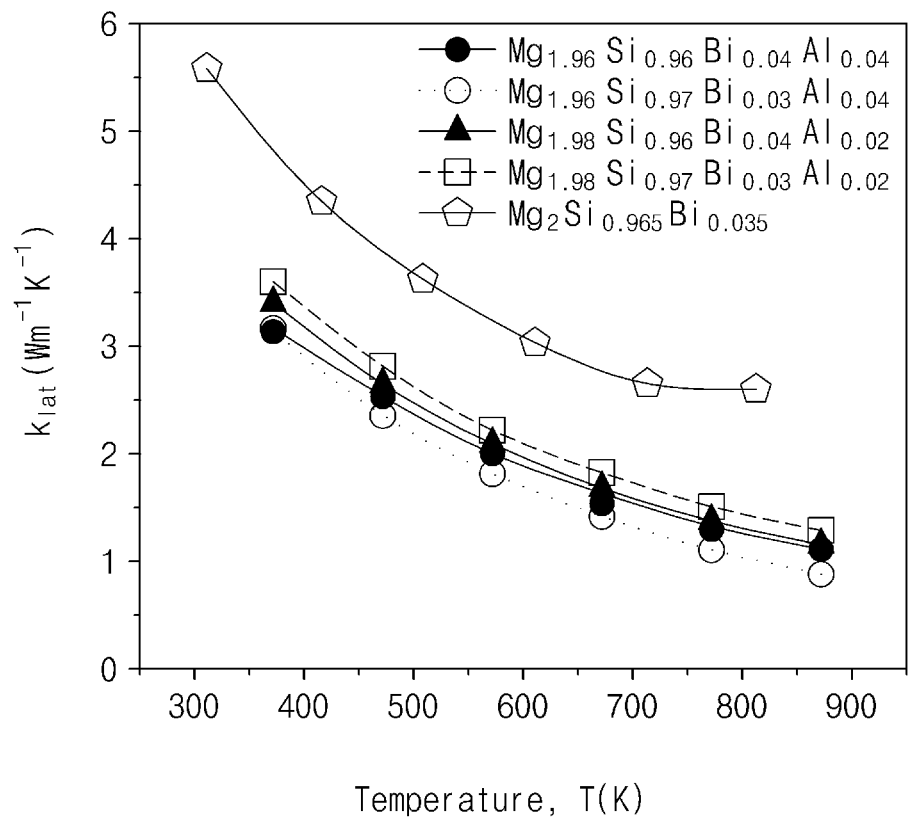
FIG. 8 illustrates results obtained by measuring lattice thermal conductivities of the thermoelectric materials prepared in Comparative Example and Examples 1 to 4 according to exemplary embodiments of the present invention.
Figure 9:
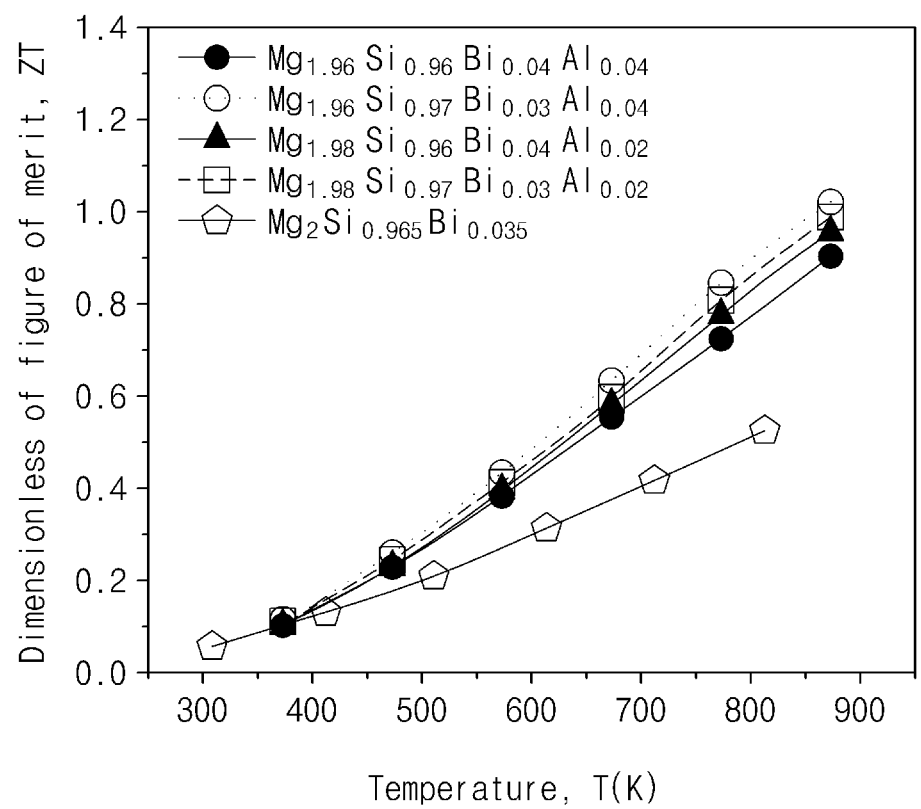
FIG. 9 illustrates results obtained by measuring figures of merit (ZTs) of the thermoelectric materials prepared in Comparative Example and Examples 1 to 4 according to exemplary embodiments of the present invention.

As shown in FIGS. 7 and 8, it may be confirmed that the thermal conductivities were decreased in Examples 1 to 4 as compared to Comparative Example. It may be determined that the thermal conductivities were decreased by phonon scattering in a phase boundary. Therefore, when the thermoelectric figures of merit were finally calculated as shown in FIG. 9, at the time of comparing thermoelectric materials prepared in Examples 1 to 4 with the thermoelectric materials prepared in Comparative Example, the thermoelectric figures of merit were increased by about 45% by an increase in power factor and a decrease in thermal conductivity.

Analysis Example 1

Deduction of Pisarenko Plot

Figure 6:
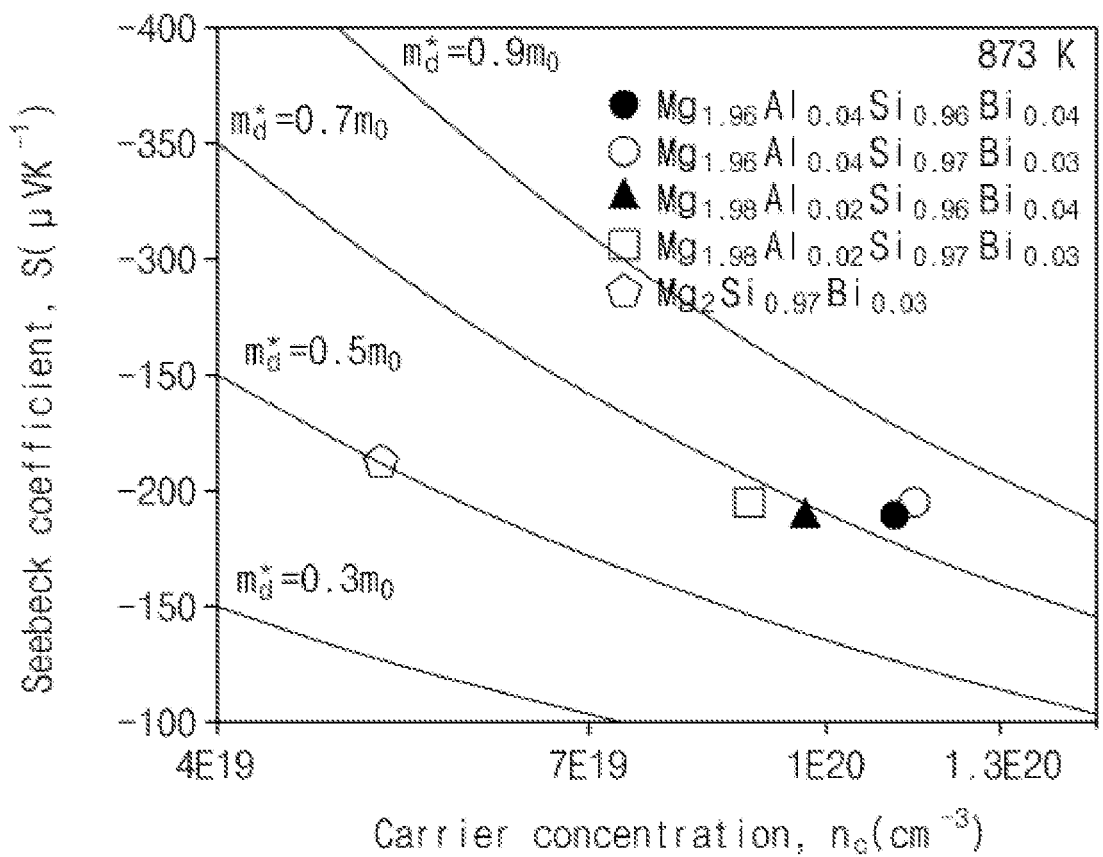
FIG. 6 is a Pisarenko plot illustrating relationships between carrier concentrations and Seebeck coefficients of the thermoelectric materials prepared in Comparative Example and Examples 1 to 4 according to exemplary embodiments of the present invention.

Pisarenko plots having a correlation with a Seebeck coefficient were deduced from carrier concentrations measured using a van der Pauw configuration method, and shown in FIG. 6.

It may be confirmed that effective mass values of electrons were changed by deformation of electron structures of the thermoelectric materials prepared in Comparative Example and Examples 1 to 4 according to exemplary embodiments of the present invention.

As described above, according to the exemplary embodiments of the present invention, the thermoelectric nanocomposite containing the matrix composed of Mg, Si, Al, and Bi components and the nanoinclusion composed of Bi and Mg components, such that the nanoinclusion may be formed in the matrix as being embedded. Accordingly, a high-density phase boundary may be formed between the matrix phase and the secondary phase, such that the thermoelectric nanocomposite may have a lattice thermal conductivity decreased by phonon scattering in this phase boundary in addition to a Seebeck coefficient increased due to the carrier filtering effect by band bending in this phase boundary. Accordingly, an increase in Seebeck coefficient and a decrease in lattice thermal conductivity may be simultaneously implemented, whereby the figure of merit of the thermoelectric nanocomposite may be increased.

Accordingly, the thermoelectric nanocomposite according to the present invention may be usefully used to implement a thermoelectric device requiring high thermoelectric efficiency.

Hereinabove, although the present disclosure has been described with reference to exemplary embodiments and the accompanying drawings, the present disclosure is not limited thereto, but may be variously modified and altered by those skilled in the art to which the present invention pertains without departing from the spirit and scope of the present invention claimed in the following claims.

What is claimed is:

1. A thermoelectric nanocomposite, comprising:
a matrix having n-type semiconductor characteristics; and
a nanoinclusion comprising Bi and Mg,
wherein the nanoinclusion is embedded in the matrix,
wherein the matrix comprises $Mg_{1.98}Al_{0.02}Si_{0.97}Bi_{0.03}$, and the nanoinclusion comprises $Bi_2Mg_3$, a weight ratio of the nanoinclusion to the matrix being 2.6±0.26%.

2. The thermoelectric nanocomposite according to claim 1, wherein the nanoinclusion has an average particle size of 1 to 500 nm.

3. The thermoelectric nanocomposite according to claim 1, wherein a density of a phase boundary between the matrix and nanoinclusion is of 350 to 4200 $cm^2/cm^3$.

4. The thermoelectric nanocomposite according to claim 1, wherein the nanoinclusion has a particle size less than a mean free path of the matrix.

* * * * *